United States Patent
Lonzarich et al.

(10) Patent No.: US 9,696,065 B2
(45) Date of Patent: Jul. 4, 2017

(54) METHOD OF MANUFACTURE OF A REFRIGERATION PILL

(71) Applicants: Gilbert Lonzarich, Cambridgeshire (GB); Stephen Rowley, Cambridgeshire (GB)

(72) Inventors: Gilbert Lonzarich, Cambridgeshire (GB); Stephen Rowley, Cambridgeshire (GB)

(73) Assignee: Stelix Limited (KY)

( * ) Notice: Subject to any disclaimer, the term of this patent is extended or adjusted under 35 U.S.C. 154(b) by 201 days.

(21) Appl. No.: 14/643,787

(22) Filed: Mar. 10, 2015

(65) Prior Publication Data

US 2015/0292782 A1 Oct. 15, 2015

(30) Foreign Application Priority Data

Apr. 14, 2014 (GB) .................................. 1406620.3

(51) Int. Cl.
*F25B 21/00* (2006.01)
*C30B 7/00* (2006.01)

(52) U.S. Cl.
CPC ............... *F25B 21/00* (2013.01); *C30B 7/00* (2013.01); *F25B 2321/001* (2013.01); *F25B 2321/002* (2013.01); *Y02B 30/66* (2013.01)

(58) Field of Classification Search
CPC ............... F25B 21/00; F25B 2321/001; F25B 2321/002; C30B 7/00; C30B 7/04; C30B 29/10
USPC ...................................................... 23/295 R
See application file for complete search history.

(56) References Cited

U.S. PATENT DOCUMENTS

| | | | |
|---|---|---|---|
| 4,892,693 A * | 1/1990 | Perrotta | C04B 35/76 164/97 |
| 6,959,554 B1 * | 11/2005 | Shirron | F25B 21/00 165/275 |
| 8,357,211 B2 * | 1/2013 | Shirron | C30B 7/04 23/295 R |
| 2003/0041600 A1 | 3/2003 | van den Berg et al. | |

(Continued)

FOREIGN PATENT DOCUMENTS

| GB | 2 414 290 A | 11/2005 |
|---|---|---|
| SU | 1179045 A1 | 9/1985 |
| WO | WO 2006/027619 A1 | 3/2006 |

OTHER PUBLICATIONS

International Search Report for Application No. PCT/GB2015/051122 dated Sep. 4, 2015.

(Continued)

*Primary Examiner* — Christopher R Zerphey
(74) *Attorney, Agent, or Firm* — Tarolli, Sundheim, Covell & Tummino LLP

(57) ABSTRACT

We describe a refrigeration pill for an adiabatic solid-state magnetocaloric or electrocaloric refrigerator, the pill having longitudinal and transverse axes, said pill comprising: a housing divided along said longitudinal axis into first and second housing parts; wherein each of said housing parts comprises a thermally conducting metal skeleton within the respective said housing part; and wherein regions within said housing between elements of said skeleton comprise magnetocaloric or electrocaloric material. We also describe methods of manufacturing the pill, and various solid state refrigeration systems, and related apparatus.

23 Claims, 10 Drawing Sheets

(56) References Cited

U.S. PATENT DOCUMENTS

| | | |
|---|---|---|
| 2004/0154312 A1 | 8/2004 | Abras et al. |
| 2011/0308259 A1 | 12/2011 | Wray et al. |
| 2012/0049103 A1 | 3/2012 | Shirron et al. |
| 2013/0074900 A1 | 3/2013 | Epstein et al. |

OTHER PUBLICATIONS

Search Report for Application No. GB1406620.3 dated Oct. 8, 2015.

Hagmann C et al: "Paramagnetic salt pill design for magnetic refrigerators used in space applications", Cryogenics, Elsevier, Kidlington, GB vol. 34, No. 3, Mar. 1, 1994, pp. 213-219.

Duval, et al.: "*A Miniature Continuous Adiabatic Demagnetization Refrigerator with Compact Shielded Superconducting Magnets*"; Astronomical Telescopes and Instrumentation, International Society for Optics and Photonics, 2004. p. 802-811.

Bromiley: "*Development of an Adiabatic Demagnetisation Refrigerator for Use in Space*"; Diss. University College London (University of London), 2000, p. 1-288.

Duval et al, 'A miniature continuous adiabatic de-magnetisation refrigerator with compact shielded super conducting magnets', in Millimetre and Sub-Millimetre detectors for Astronomy II, Ed J Zmuidzinas et al, SPIE vol. 5498 pp. 802-311.

oaul a Bromiley, PhD thesis, University of London 1999, 'Development of an adiabatic de-magnetisation refrigerator or use in space' [see particularly pp. 199-200].

\* cited by examiner

METHOD OF MANUFACTURE OF A REFRIGERATION PILL

RELATED APPLICATIONS

The present invention claims priority from GB406620.3, filed 14 Apr. 2014, the entirety of which is incorporated herein by reference.

FIELD OF THE INVENTION

This invention relates to products, methods and apparatus for solid state refrigeration systems such as those employing the magnetocaloric or electrocaloric effect.

BACKGROUND TO THE INVENTION

Typically a cryogenic adiabatic demagnetisation refrigerator (ADR) is used for achieving very low temperatures, for example below 1 K, potentially below 1 mK after initial cooling to between 1 K to 4 K using liquid helium or liquid cryogen free cooling techniques. Broadly speaking a magnetocaloric material is employed, typically a paramagnetic material with a high magnetic susceptibility and large entropy change under the application of magnetic fields. This is held at a constant temperature whilst a field is applied and then the field is removed adiabatically allowing the magnetic moments to randomise resulting in a reduction in temperature. The magnetocaloric material is generally a paramagnetic salt such as CMN (cerium magnesium nitrate).

In principle a solid state refrigerator may be based on an electrocaloric or thermoelectric material rather than a magnetocaloric material. The electrocaloric refrigeration method has a similar underlying cooling principle, related to electric rather than magnetic degrees of freedom and alignment of internal electric polarisation. At present, however, suitable electrocaloric materials are less well developed for a working device although alkali halides such as KCl doped with polarisable impurities such as $Li^+$, $OH^-$ and $CN^-$ show promise.

ADR based technology is employed, inter alia, for space applications (for example J-M Duval et al, 'A miniature continuous adiabatic de-magnetisation refrigerator with compact shielded super conducting magnets', in Millimeter and Sub-Millimeter detectors for Astronomy II, Ed J Zmuidzinas et al, SPIE Vol 5498 pp 802-811); further background prior art can be found in Paul A Bromiley, PhD thesis, University of London 1999, 'Development of an adiabatic de-magnetisation refrigerator for use in space'.

Typically the magnetocaloric material is provided within a cooling 'pill', generally a metal cylinder within which crystals of the material are grown. The cylinder may be sealed to inhibit dehydration of the salt. In the pill of Duval et al the salt is grown in a brass can containing copper wires braised to a thermal bus; in that of Bromily's thesis a thermal bus is employed consisting of a set of fins connected to a central pillar. These designs, however, have significant disadvantages. For example the approach of Bromiley involves machining components from solid which is very expensive. In both designs it can take a period of days to weeks to grow the salt crystals, and short pill lifetime and relatively poor thermal conductivity are also problems.

The heat switch in an ADR can also be a source of design difficulties—US2003/0041600 describes an electro-mechanical heat switch but this is complicated, expensive and cumbersome to use in practice.

Other difficulties include sealing the pill to inhibit dehydration, particularly in a vacuum, and under large changes in temperature. This is problematical because epoxy seals tend to crack upon repeated thermal cycling whilst welded seals are expensive and difficult to produce without compromising the performance of the refrigerant through overheating.

There is thus a need for improvements in the design of adiabatic solid-state magnetocaloric and electrocaloric refrigerators.

SUMMARY OF THE INVENTION

According to a first aspect of the invention there is therefore provided a refrigeration pill for a solid-state magnetocaloric or electrocaloric refrigerator, the pill having longitudinal and transverse axes, said pill comprising a housing containing: an internal mounting structure divided along said longitudinal axis into first and second mounting parts; wherein each of said mounting parts comprises a thermally conducting metal skeleton defined by the respective said mounting part; and wherein regions within said housing between elements of said skeleton comprise magnetocaloric or electrocaloric material.

Embodiments of this structure enable the crystallisation of materials from a solution to proceed nearly an order of magnitude faster than with conventional approaches.

In embodiments the pill comprises two half-cylinders split along the cylinder length and the crystallisation may therefore be carried out for the two half cylinders at the same time, and in addition with the crystal growth along a direction normal to the cylinder axis (the short direction) rather than along the cylinder axis (the long direction). The crystallisation time along the short direction can be nearly an order of magnitude faster than for growth along the long direction. Moreover, the structure facilitates monitoring the progress of crystal growth, for example to ensure that the crystals grow systematically in the preferred direction substantially without voids. In addition for some materials, for example CMN (cerium magnesium nitrate), the longitudinally split structure enables growth of the crystals perpendicular to the longitudinal axis. This is a better alignment for a typical magnetic field direction within a refrigerator (which is along the longitudinal axis). Still further, crystals grown in such a structure bond well to the skeleton (and housing, where grown in the housing) without the need for glue or the like which other techniques have required.

Various types of metal skeleton may be employed and during the growth of the crystals, for example of a paramagnetic salt; the presence of the housing is optional. The outer housing may be in two parts and present during crystal growth or the two mounting parts may be assembled within a single outer, preferably cylindrical housing after crystal growth.

In one embodiment the metal skeleton may comprise a volume-filling metal mesh or woven or helical arrangement of wires attached to a thermal contact, for example welded to a screw-thread, at either end of the pill. In other embodiments the skeleton may comprise a set of wires running longitudinally between end plates, again each with a thermal contact. The wires may be copper, preferably gold plated to inhibit corrosion, or solid silver.

In one particularly preferred embodiment the skeleton comprises a set of transverse metal fins, for example half-discs spaced at intervals along the longitudinal axis. In embodiments where there are two housing portions the skeleton may lie within and preferably in thermal contact with each housing portion, for example each half-cylinder.

As well as facilitating a good heat flow within the pill this arrangement also facilitates rapid crystal growth and reduces corrosion. In a preferred embodiment the metal fins comprise silver fins.

In a further embodiment, which may optionally be combined with a skeleton as previously described, the skeleton comprises metal filaments or dendrites within the magnetocaloric material. In embodiments these filaments or dendrites are grown within the crystal structure of the magnetocaloric material as the material crystallises, for example by providing a suspension of silver powder which floats on top of or permeates the solution from which the material is crystallising or otherwise deposited. This structure has been found to be particularly effective at improving thermal conductivity, providing one or two orders of magnitude improvement in conductivity. In embodiments the filaments or dendrites comprise silver, for good conductivity and corrosion resistance, but other metals may also be employed.

Where an electrocaloric material is employed the metal skeleton may be used to provide connections to what are effectively plates/electrodes of one or more capacitors within the pill. Here 'plates' is used in a functional sense without implying any particular structural configuration, but nonetheless a skeleton comprising a set of metal fins or half-discs is preferred with an electrocaloric material. That is because this provides an efficient multi-layer capacitor-type structure which can be used to apply an electric field to the material. In such an arrangement the fins/discs may be supported on one or more rods running parallel to the longitudinal axis and every alternate fin/disc electrically isolated from each other. Conveniently a pair of rods may be used to provide interleaved electrical connections to the fins/plates. In embodiments a plastic housing may suffice, particularly where the electrocaloric material is relatively non-volatile.

As previously mentioned, in some preferred embodiments the magnetocaloric/electrocaloric material is grown as a crystal within each of the mounting parts with an axis of growth substantially perpendicular to the longitudinal axis. This may be achieved by resting each mounting part within a crystal growth trough, with the longitudinal axis substantially horizontal, optionally seeding the crystal growth at the bottom. The liquid-solid interface then grows upwards from the bottom on each mounting part upwards. The growth interface may be perpendicular to one axis of the crystals. For some paramagnetic salts the direction of field with respect to that of crystal growth may be less important but for other materials, for example CMN (and especially those used in achieving particularly low temperatures), it is preferable that the field is applied at right angles to the direction of crystal growth—that is with a component along the longitudinal axis with a major component. Growing the material as a crystal is not, however, essential to producing embodiments of the pill and in other approaches the magnetocaloric or electrocaloric material may, for example, simply be pressed.

In embodiments the two mounting parts may be sealed within an outer housing such as an outer cylinder to protect the pill from damage/dehydration/decomposition. The housing is preferably metal for a magnetocaloric material but is preferably insulating, for example plastic, for an electrocaloric material. In embodiments the outer housing or cylinder may be sealed to a flange at either end of the pill, preferably using O-rings such as indium O-rings. This avoids the problems associated with welded joints and epoxy found with prior art arrangements.

In a related aspect the invention provides a refrigeration pill for a solid-state magnetocaloric or electrocaloric refrigerator, in particular an adiabatic magnetocaloric or electrocaloric refrigerator, the pill having longitudinal and transverse axes, said pill comprising: a longitudinal housing and a pair of pill end stops, one towards either end of the housing; wherein said end stops carry a thermally conducting metal skeleton extending longitudinally between them; wherein said end stops are sealed against a (circumferential) wall of said housing; and wherein regions within said housing between elements of said skeleton comprise magnetocaloric or electrocaloric material.

The skilled person will recognise that features of the previously described aspect of the invention are also applicable to this aspect, and vice-versa.

Thus in some preferred embodiments the pill has an end stop or cap which comprises a sealing mechanism. The sealing mechanism may comprise a longitudinally moveable sealing part or plate and a mechanism, for example a screw thread and nut, to force the sealing part towards the end stop. The end stop and sealing part define a ring-shaped region or groove adjacent to an internal surface of the circumferential wall of the housing. A sealant is provided within this region, for example indium or sapphire loaded epoxy. When the sealing part is forced towards the end stop the sealant is forced outwards to form a seal against the internal surface of the circumferential wall of the housing. A mounting post for the pill may provide a screw thread of the sealing mechanism.

In embodiments the metal skeleton comprises a set of wires or mesh extending longitudinally between the end stops. The wires or mesh may be fabricated from copper or gold-plated copper.

The invention also provides a method of manufacturing a refrigeration pill for an adiabatic solid-state magnetocaloric or electrocaloric refrigerator, the method comprising: providing a mounting structure in two parts divided along a longitudinal axis of said refrigeration pill, said mounting structure having a metal skeleton; growing a crystal structure of magnetocaloric or electrocaloric material on the skeleton of each said mounting part; and assembling said mounting parts to manufacture said refrigeration pill.

The skeleton may be an internal skeleton and/or an exoskeleton—for example a mounting part may define a trough within which the crystal material is grown.

The invention further provides a method of manufacturing a refrigeration pill for an adiabatic solid-state magnetocaloric or electrocaloric refrigerator, the method comprising growing a crystal structure of magnetocaloric or electrocaloric material around said metal skeleton; in particular wherein said growing is performed with said longitudinal axis of said housing part substantially horizontal.

A refrigeration pill, in particular as described above, may be incorporated into a cryogenic refrigerator such as an adiabatic solid-state magnetocaloric or electrocaloric refrigerator. In such an arrangement a first refrigeration stage is preferably a metal plate cooled by a self-contained refrigeration stage ("the cryogenic platform") employing either liquid helium or a liquid cryogen free system, such as a pulse tube cooler or a Gifford-McMahon cooler. A second refrigeration stage comprises the refrigeration pill and this is thermally connected to the first stage via a heat switch so that the solid-state refrigeration pill can be cooled by the first stage and then thermally decoupled from the first stage for a further stage of cooling of the sample. In some preferred arrangements, but not essentially, the heat switch is a mechanical heat switch. However there are difficulties in providing a mechanical heat switch operable at low temperatures which is suitable for use in a relatively light weight structure whilst still having a low on-resistance.

According to a further related aspect of the invention there is therefore provided a refrigeration system comprising: a first refrigeration stage, in particular a liquid helium-4 refrigerator or a liquid-cryogen free refrigerator (e.g. a pulse tube cryocooler or Gifford-McMahon cryocooler) or a liquid-cryogen free refrigerator combined with a pumped liquid helium-4 1K cooling system or helium-3 cooling system; a second refrigeration stage comprising a solid-state refrigerator (SSR), said SSR comprising a refrigeration pill; and a heat switch, in particular a mechanical heat switch, thermally coupling said first and second refrigeration stages and arranged to selectively decouple said thermal coupling. In preferred embodiments said mechanical heat switch comprises first and second metal contacts to said first and second refrigeration stages respectively, and an actuator moveable longitudinally between a first coupling position in which said heat switch provides a thermal path between said contacts and a second, decoupled position in which said thermal path is broken; wherein said mechanical heat switch further comprises a set of one or more arms, moveable radially to thermally couple and decouple said metal contacts, and wherein said longitudinal movement of said actuator provides a camming action to move said one or more arms radially to operate said heat switch.

The first refrigeration stage is preferably a liquid helium-4 refrigerator system or a liquid-cryogen free refrigerator system (e.g. a pulse tube cryocooler or Gifford-McMahon cryocooler), or either of these combined with a pumped liquid helium-4 cooling system, or a liquid-cryogen free refrigerator optionally combined with a pumped liquid helium-4 cooling system, or a helium-3 cooling system.

In some preferred embodiments the heat switch comprises a coronet-shaped switching portion mounted on a collar or similar around which the set of arms is disposed circumferentially. A camming feature, which may be located either inside or outside the arms, is moved longitudinally to either push the arms outwards or, in an alternative arrangement, push the arms inwards, to make thermal contact with one of the metal contacts. In some embodiments the actuator is mounted on a screw arrangement so that rotation of the screw moves the actuator longitudinally. This type of arrangement can apply a very large outwards (or inwards) radial force, for example of some hundreds of pounds, within the context of a simple lightweight structure. This can thus achieve a very low thermal-on resistance and provide very good thermal isolation when off. In one embodiment one or both of the contacts comprises gold plated metal; in one embodiment the coronet of arms is located within a cup, the arms being moveable radially outwards to contact an inner surface of the cup, which forms a further metal (thermal) contact for the switch.

The invention also provides a removable cooling assembly for a refrigeration system comprising first and second refrigeration stages as previously described, connected by a mechanical heat switch, the second refrigeration stage incorporating a sample region (the region where a device or material under test may be placed). In embodiments the sample region is adjacent the heat switch and the refrigeration pill of the second refrigeration stage is beyond the sample region in a direction away from the heat switch, the first refrigeration stage being connected to the heat switch. This provides an assembly which facilitates access to the sample space and which has a room-temperature end and region at which the temperature is less than 1 K, and in embodiments the assembly may be self-contained and removable as a unit from the cryogenic platform/refrigeration system ("the sample insert"). The arrangement also facilitates multi-stage cooling—for example a third refrigeration stage may be located along the longitudinal axis beyond the second refrigeration stage (going away from the sample region), connected to the second stage via a further heat switch. The skilled person will recognise that in these arrangements the heat switch may be of any suitable type including, for example, a mechanical heat switch, a superconducting heat switch, a gas heat switch or a piezoelectric heat switch.

In a further related aspect the invention provides a mechanical heat switch to switch a thermal coupling between first and second stages, wherein said mechanical heat switch comprises first and second metal contacts to said first and second stages (in embodiments first and second heat sources/sinks) and an actuator moveable longitudinally between a first coupling position in which said heat switch provides a thermal path between said contacts and a second, decoupled position in which said thermal path is broken; wherein said mechanical heat switch further comprises a set of one or more arms, moveable radially to thermally couple and decouple said metal contacts, and wherein said longitudinal movement of said actuator provides a camming action to move said one or more arms radially to operate said heat switch.

The invention also provides a superconducting heat switch comprising first and second metal thermal contacts connected by a sheet of foil made out of a superconducting material such as lead or tin. When the foil is in its normal metallic state, which may be achieved by applying a large enough magnetic field, the heat switch is closed. When in the superconducting state the heat switch is open.

Preferably the metal thermal contacts are mechanically supported and attached to each other by a thermally insulating housing, typically made out of a plastic material; preferably the lead or tin foil has an impurity level of less than 10 ppm.

The invention further provides an adiabatic solid-state refrigeration system comprising: two solid-state refrigeration stages each thermally coupled to the same sample chamber, each comprising an adiabatic solid-state refrigerator (ASR), said ASR comprising a refrigeration pill, each with a respective controllable magnetic/electric field generator; and a control system to control removal of said magnetic/electric field from each of said pills sequentially to control cooling of said sample chamber.

In an adiabatic demagnetisation refrigerator the control system may control removal of a magnetic field/demagnetisation of a pill; where the pill contains electrocaloric material an electric field may be removed from the pill, for example by reducing or removing a voltage across the pill.

Such a system may operate in series, to facilitate reaching a lower base temperature, or in parallel, to provide substantially continuous cooling, or may be configurable for either mode of operation. In either case it is practically convenient to arrange the solid-state refrigeration stages physically in series longitudinally with, for example, a copper rod connecting each longitudinally to the sample chamber.

In a series configuration the sequential control is configured to cool the sample chamber successively with a first then a second of the solid-state refrigeration stages. This may be extended to further refrigeration stages. The solid-state refrigeration stages may be thermally coupled in series via one or more heat switches such as those previously for example, a mechanical or superconducting heat switch, in particular as previously described, or a gas or a piezoelectric heat switch.

In a parallel configuration, in particular for continuous sample cooling, the solid-state refrigeration stages are thermally coupled in parallel to said sample chamber each via a respective heat switch. The system further comprises a first refrigeration stage, for example a metal plate cooled by a liquid helium-4 refrigerator or a liquid-cryogen free refrigerator (e.g. a pulse tube cryocooler or Gifford-McMahon cryocooler), or either of these combined with a pumped liquid helium-4 1 K cooling system or helium-3 cooling system. Each of the solid-state refrigeration stages may then be thermally coupled to the first refrigeration stage via a further respective heat switch. The control system may then be configured to control the heat switches and the magnetic/electric field (as mentioned previously) such that one of said solid-state refrigeration stages is cooling the sample chamber whilst the other is (being electrically or magnetically polarised and) being cooled by the first refrigeration stage, and vice versa. Thus, designating the first-second stage heat switches "input" heat switches and those to the sample chamber "output" heat switches, the input heat switch for the first pill is on whilst its output switch is off and at the same time as the input heat switch for the second pill is on whilst its output switch is on. During this interval and the field is applied to the first pill and removed from the second pill. The on/off configurations of the heat switches are then reversed and the field is applied to the second pill and removed from the first pill.

In a still further aspect the invention provides an adiabatic solid-state refrigeration system comprising two separate or linked stages, a first, cryogenic device cooling stage, and a second sample cooling stage; and a cryogenic device comprising an adiabatic solid-state refrigerator (ASR), said ASR comprising a refrigeration pill, in particular as described above, and a system to maintain said pill in an electric or magnetic field; wherein said first, cryogenic device cooling stage comprises a first refrigeration stage for cooling said cryogenic device; wherein said second, sample cooling stage comprises said cryogenic device thermally coupled to a sample platform for cooling a sample; wherein said electric or magnetic field is removeable from said pill when said cryogenic device for cooling said sample; and wherein said cryogenic device is thermally coupled to said sample platform through a boundary such that heat flows radially outwards from said sample platform.

In some embodiments the sample may be held within a removeable vacuum tube defining the boundary through which heat flows radially. In embodiments a housing for the first and second cooling stages defines a second vacuum space containing the vacuum tube and both the first and second cooling stages. In embodiments, the cryogenic device may be displaced longitudinally from the sample platform and coupled to the sample platform via a thermally conductive path. In embodiments at least one heat switch is provided between the cryogenic device and the first, cryogenic device cooling stage.

It is particularly convenient if the pill comprises electro-caloric or thermoelectric material since in this case it is straightforward to maintain/remove the electric field from the pill as required. In particular where a solenoid is used to maintain the magnetic field in an adiabatic demagnetisation system, this restricts physical access to the cooled region to directions along the axis of the solenoid—but the refrigeration system may then be configured with a thermal path between the cryogenic device (ASR) and the sample platform boundary. By contrast where an electric field is used to facilitate refrigeration, other directions, for example the radial direction, may be used to thermally connect the sample chamber and cryogenic device with one another.

Thus in the case of any of magneto-caloric, electro-caloric or thermoelectric solid-state coolers, there may be provided a facility for the refrigeration to be carried out horizontally away from the sample holder cryogenic insert, thermal contact being made through a boundary. In embodiments this results in both cooling stages being carried out on the platform and the sample holder simply being slid in to the cold region and mounted on a sample platform when needed. Thermal contact may then be made going radially out from the sample platform through the vacuum tube containing the sample space to the base temperature plate of the cryogenic platform. Such an arrangement may be employed with multiple cryogenic devices (ASRs), connected to operate in series, in parallel, or both. Thus, for example, each may have one or both of an input heat switch (coupling the cryogenic device to the first, cryogenic device cooling stage) and an output heat switch (coupling the cryogenic device to the sample platform).

BRIEF DESCRIPTION OF THE DRAWINGS

These and other aspects of the invention will now be further described, by way of example only, with reference to the accompanying figures in which:

FIG. 5 shows a microscopic region of a solid-state magneto-caloric material inside a refrigeration pill such as the type of FIG. 4a;

DETAILED DESCRIPTION OF PREFERRED EMBODIMENTS

Figure 1:
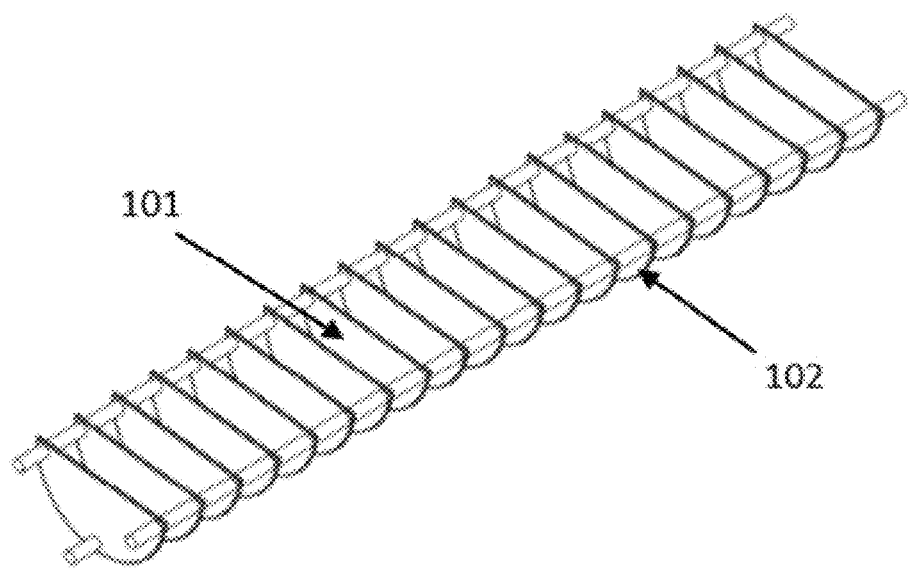
FIG. 1 shows a multi-plate half-cylinder assembly for a magnetic refrigeration pill according to a first embodiment of the invention, the pill comprising two conjoined half-cylinders (of which only one is shown) each incorporating a set of half-discs spaced at intervals along the longitudinal axis.

Broadly speaking in embodiments the skeleton for each half of the pill involves the following components, all of which are gold plated high purity OFHC copper: i) a central supporting rod of rectangular cross-section running along the length of the half cylinder, ii) three perforated half discs braised to the supporting rod near the ends and centre of the rod, iii) of the order of 100×0.4 mm wires threaded through and braised to the equally spaced holes in the perforated half discs. Braised at both ends of one of the two skeletons (made with an extra-long supporting rod) is an end piece consisting of a flange with a threaded nipple.

In a more symmetrical alternative design the two skeletons are identical in that a single flange with a threaded nipple is braised at one end only of each skeleton in such a way as to make the nipple concentric to the axis of the outer sealing tube.

In an alternative to the above procedure the rectangular central supporting rod is replaced by two threaded rods passing through holes near to the two corners of the half disc and the third threaded rod equidistant to the first two and passing through a hole near the edge of the disc. The advantages of this scheme include: i) it provides for accurate alignment of the half discs; ii) it allows for the use of nuts to lock the plates in position and at the correct height, and hence avoid the need for braising; iii) it also allows for connection to the end flanges with threaded nipples via the use of copper nuts as above, and hence again avoids the need for braising; and iv) the procedure can readily be adapted with only minor changes (merely by increasing the number of half-discs employed, eliminating the wire assembly and replacing every other copper nut with an insulating ceramic nut and washer) for the preparation of multi-layer capacitor refrigeration pills using electrocaloric rather than the magnetocaloric effect that is the focus of attention here.

The two flanges, one at each end, are used for fitting an outer thin-wall sealing tube made of either fibre glass, stainless steel, brass or phosphor bronze. One of the two threaded ends is used to join the pill to the object to be cooled and the second is used in applications involving more than one cooling stage or to connect the pill to a thermally insulating centring ring. Each half skeleton in its entirety is gold plated after it has been assembled.

Some advantages of the half-disc arrangement are as follows: i) it provides for accurate alignment of the half discs; ii) it allows for the use of nuts to lock the plates in position at the correct height, and hence avoid the need for braising or welding; iii) it also allows for connection to the end double flanges with threaded nipples via the use of copper nuts as above, and hence again avoids the need for braising or welding; and iv) the procedure can readily be adapted with only minor changes (merely replacing every other copper nut with an insulating ceramic nut and washer) for the preparation of refrigeration pills using electrocaloric rather than the magnetocaloric effect.

The two skeletons are placed in a crystal growing trough and crystals are grown in both halves at the same time out of a solution containing the solute. Crystals grow as the concentration of the solute increases either by the evaporation of the solvent (typically water) or by a decrease in the temperature of the solution, or by a combination of the two methods. In the new procedure, crystal growth can typically be completed in a single day compared with weeks via current methods. Also crystals grown in this way are naturally aligned along the ideal crystallographic orientation for optimum magnetic refrigeration especially in the case of particular crystals (such as CMN) where this is necessary.

The surfaces of the two half-cylinders are leveled in preparation for assembly into a single cylinder in which the supporting rods are clamped together with screws near the ends. In contrast to current practice the outer cylinder used to protect the pill from damage and dehydration may be sealed via the use of indium O-rings, instead of epoxy or welded joints. Indium O-rings produce excellent seals, are inexpensive and easy to use, have low outgassing and vapour pressures, can be thermally cycled repeatedly without failure, eliminate the risk of damage to the refrigerant due to overheating (cf. curing of epoxies at elevated temperatures or use of a welding technique), and allow for the quick assembly as well as disassembly of the pill. This latter allows for non-destructive access to the core of the pill (crystallised salt and supporting skeleton) to allow for recycling of the parts of the assembly.

Referring now to FIG. 1, this shows one of the two half cylinder skeletons used as a component to make a solid-state refrigeration pill. The parts shown in FIG. 1 comprise plates 101 and rods 102. Both the plates and rods are made out of gold plated high conductivity oxygen-free copper or solid silver. Gold or silver are used to avoid corrosion of the thermal transport paths by the solid-state refrigeration material. The rods may be braised onto the plates or alternatively threaded to allow the plates to be secured with nuts before any gold plating, in either case mechanical stability and excellent thermal contact are achieved. The plates and rods form a thermal path in which to conduct heat efficiently throughout the half-cylinder.

Figure 2:
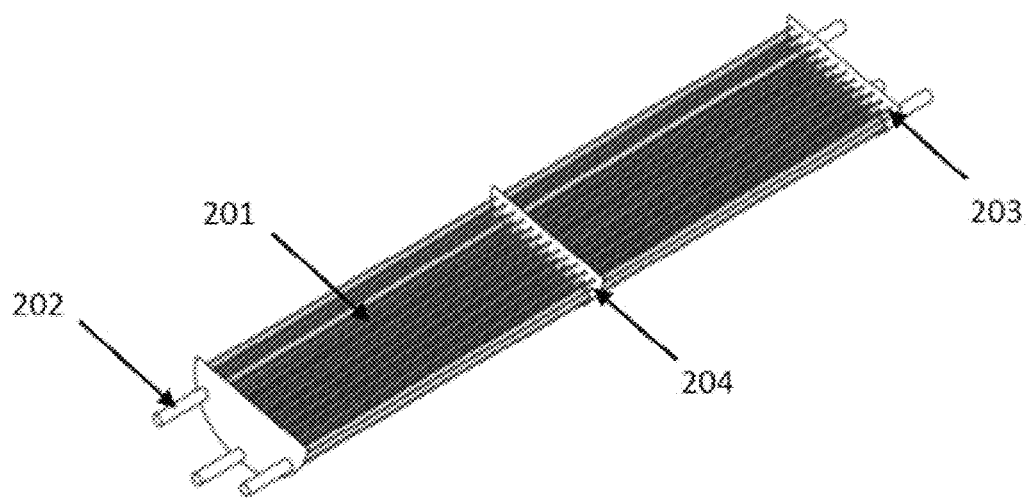
FIG. 2 shows an alternative, multi-wire half-cylinder assembly.

FIG. 2 shows an alternative half-cylinder design comprising wires 201, support rods 202, end plates 203 and guide plate 204. All parts 201, 202, 203 and 204 are made out of gold-plated oxygen-free high conductivity copper or solid silver. The rods 202 are braised to the parts 203 and 204 or attached with nuts. The wires 201 are braised or soldered to the parts 203 and 204. The plates, wires and rods form a thermal path in which to efficiently conduct heat throughout the half-cylinder.

Figure 3:
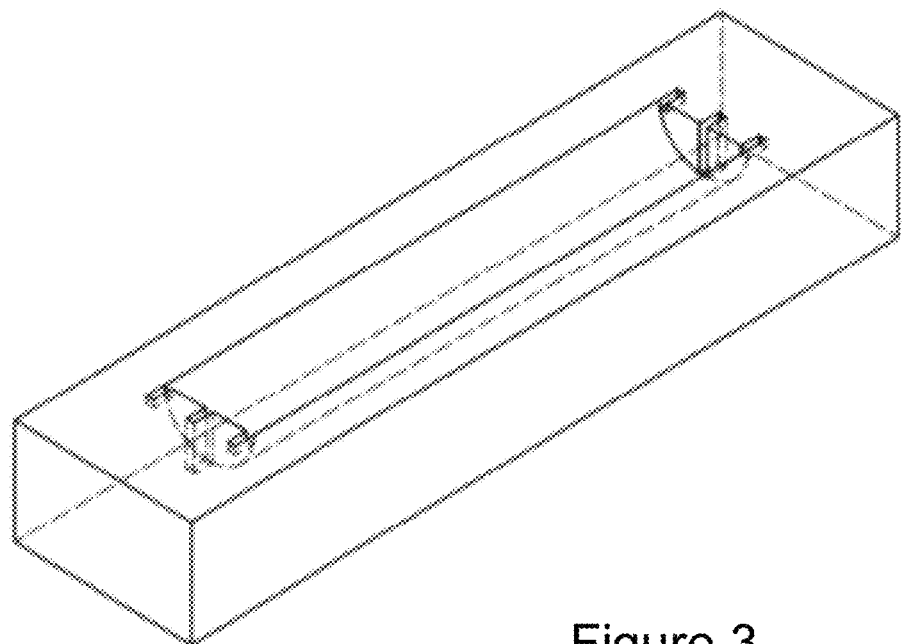
FIG. 3 shows a schematic diagram of a crystal growing trough for use in a method of manufacturing a refrigeration pill of the type illustrated by FIGS. 1 and 2; the vertical direction defines a direction of crystal growth; a magnetic field may be applied with a component in the longitudinal (horizontal) direction.

FIG. 3 shows a plastic crystal growing trough for use with assemblies such as those shown in FIG. 1 and FIG. 2 for the case when the solid-state refrigeration crystals are grown out of liquid solution. In such a case a half-cylinder assembly as shown in FIG. 1 and FIG. 2 is placed into the crystal growing trough and the solution poured into the trough with the solid-state refrigeration compound as a solute. In this scheme crystals are able to grow perpendicular to the axis of the cylinder, and crystal growth is quicker than in the case of growing crystals in a closed tube along the direction of the cylinder axis. In the case when the solid-state refrigeration material is not grown out of solution, powdered material may be pressed or glued onto metallic plates such as those in FIG. 1.

Figure 4A:
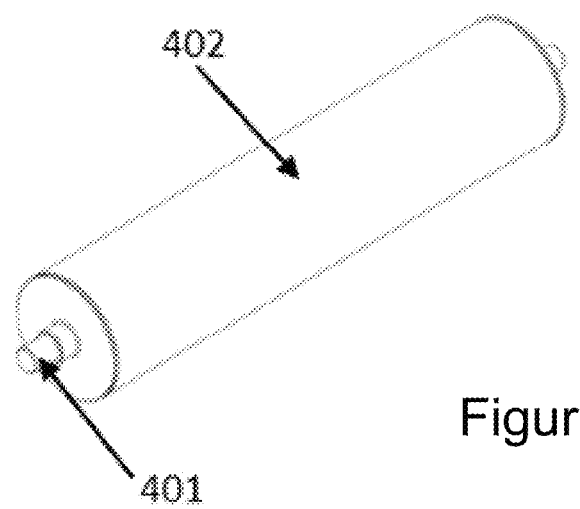
FIGS. 4a and 4b show, respectively, a fully constructed solid-state refrigeration pill sealed within an outer cylinder, and a section through the end cap along the axis of the cylinder in showing a preferred sealing method.
Figure 4B:
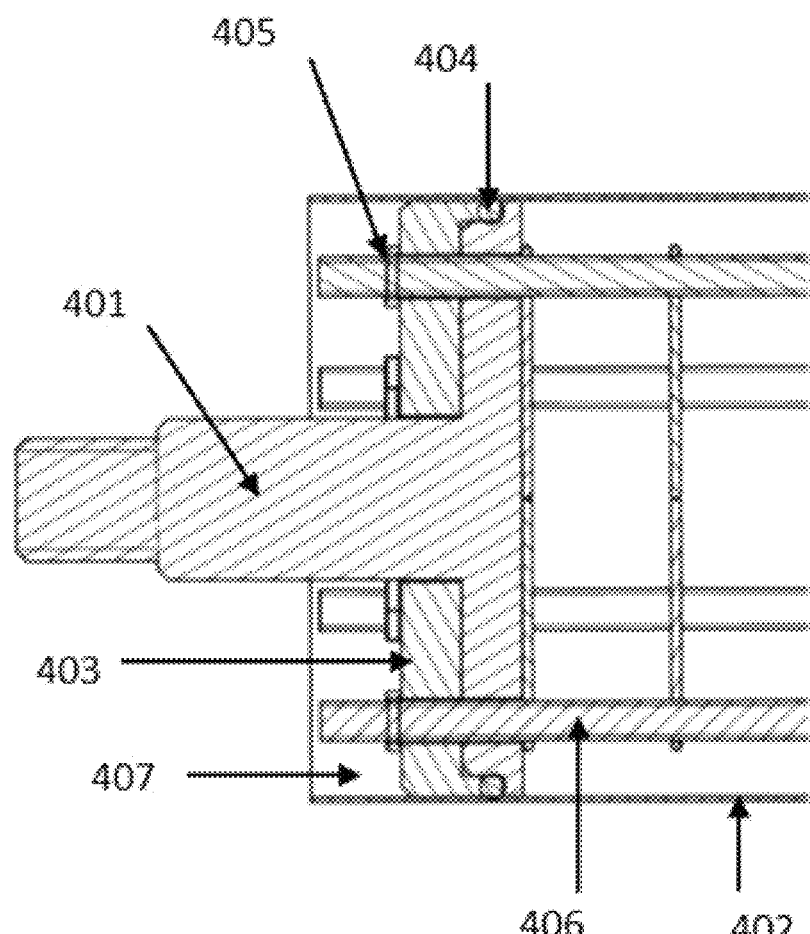

Once the solid-state refrigeration material has been located onto skeletons such as those shown in FIGS. 1 and 2, either via crystal growth from liquid solution or via pressed powders, the two half cylinders are brought together and attached with threaded end caps and encapsulated in an outer cylinder as shown in FIG. 4a. The outer cylinder labelled 402 in FIG. 4a is made out of thin walled phosphor bronze, stainless steel, brass or fibreglass. The threaded end cap labelled 401 is made out of gold plated high conductivity oxygen-free copper. One or both of the threaded end caps may be used to attach the refrigeration pill to the object or objects to be cooled, or used to attach the pill to other parts as may be necessary. FIG. 4b shows a particular sealing mechanism employed to ensure the chemical content of the refrigeration pill is hermetically sealed inside the pill and maintains integrity during repeated thermal cycling between 300K and cryogenic temperatures. The rods 406 (the same as those as labelled 102, 202 in FIGS. 1 and 2) pass through clearance holes in the end cap 401 and sealing plate 403. Nuts 405 are screwed onto each of the threaded rods and used to tighten the sealing plate against the end cap squashing an indium wire 404 which under compression flows into any gaps and against the outer cylinder 402 making a vacuum tight seal. The region labelled 407 may then be filled with epoxy to provide an additional seal and further mechanical stability. The epoxy is selected to have a thermal expansion matched to the metals used to make the end cap. The solid-state refrigeration material is hermetically sealed inside the pill to avoid possible degradation on exposure to the outside environment. The sealing procedure is then repeated at the other end of the pill.

Figure 5:
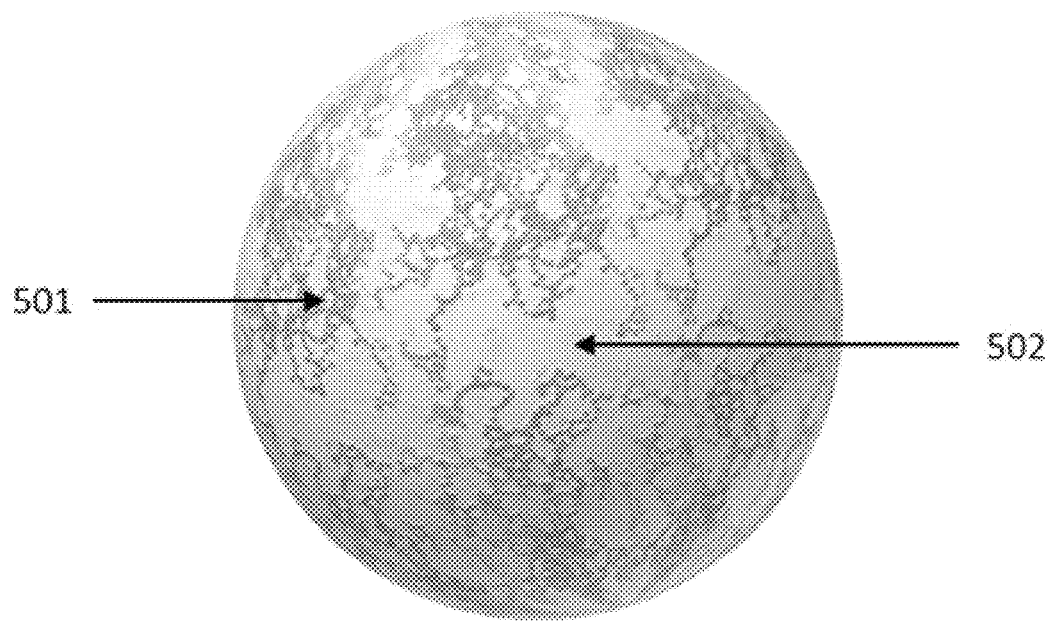

FIG. 5 shows a microscopic region of a solid-state magneto-caloric material inside a refrigeration pill such as that shown in FIG. 4a. Silver particles 501 are mixed with the solid state material 503 before and/or during the crystal growth process in the case of crystals grown from solution. In the case of a powdered solid-state refrigeration material, the silver particles are mixed with the powder before pressing onto plates such as those in FIG. 1, part 101. In either case the silver particles form dendrite like paths and assist thermal transport inside the completed pill resulting in more efficient cooling of the object to be refrigerated.

Figure 6A:
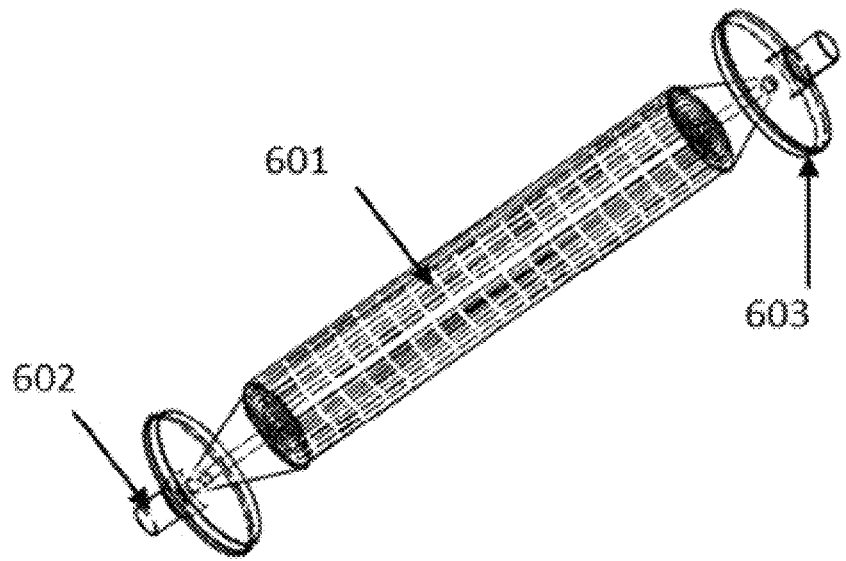
FIGS. 6a and 6b show components of two alternative pill designs (a) and (b) based on a single cylinder illustrating, respectively, a magnetic refrigeration pill incorporating a metal skeleton comprising a wire mesh, and a magnetic refrigeration pill incorporating a metal skeleton comprising a set of longitudinal wires
Figure 6B:
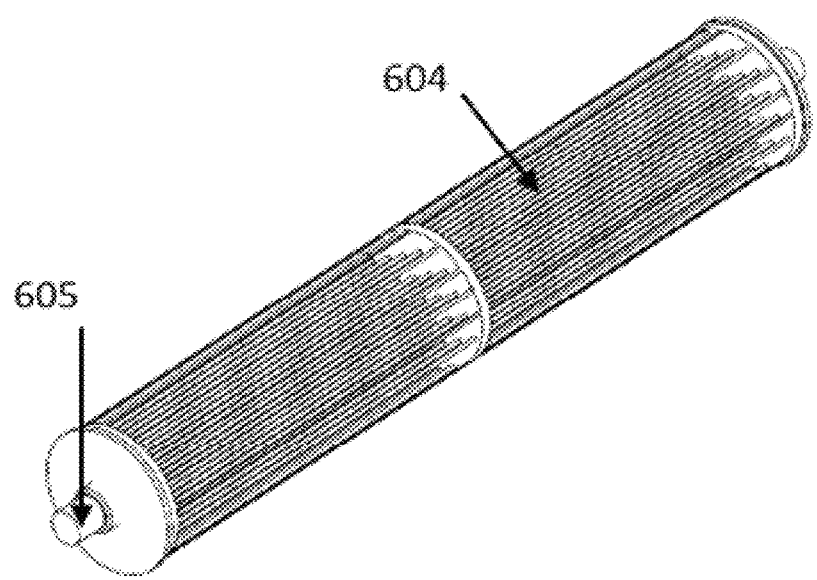

FIG. 6 shows components of two alternative pill designs (a) and (b) based on a single cylinder. In FIG. 6a, a copper mesh 601 is rolled into a spiral and welded at each end to threaded end pieces 602. Preferably the entire assembly is then gold plated. Magneto-caloric refrigeration material is grown from solution directly onto the wire mesh. End caps 603 are then fitted along with an outer cylinder to hermitically seal in the contents of the pill resulting in a finished pill like that shown in FIG. 4a. In FIG. 6b a similar design is employed but using gold-plated high conductivity oxygen free copper wires or solid silver wires 604, which are again welded to threaded end pieces 605. Magneto-caloric material is then grown onto the wires directly and hermetically sealed in an outer cylinder resulting in a pill like that shown in FIG. 4a.

Figure 7:
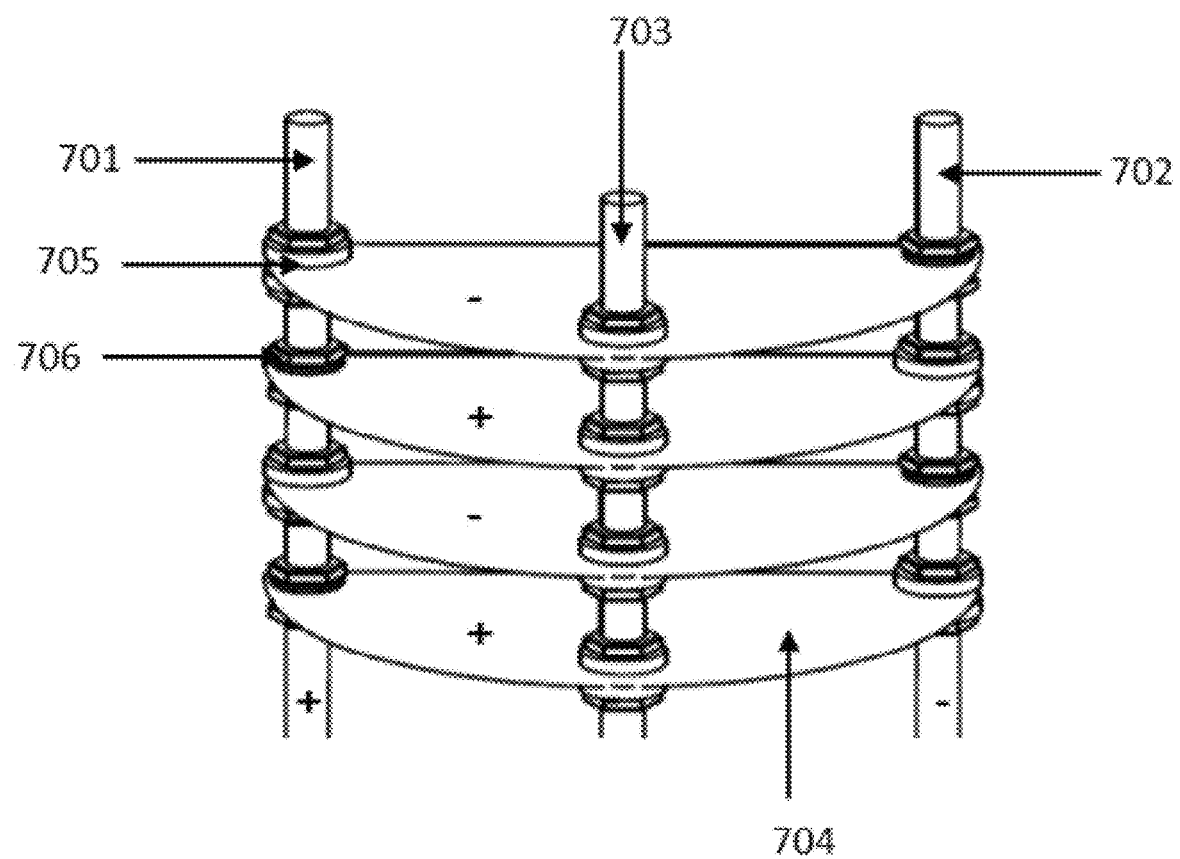
FIG. 7 shows a region of an internal skeleton of a refrigeration pill of the general type shown in FIG. 1, adapted for use with electro-caloric rather than magneto-caloric material and comprising an arrangement for alternate electrically insulated adjacent half discs.

FIG. 7 shows a region of an internal skeleton of a refrigeration pill similar to that shown in FIG. 1 but adapted for use with electro-caloric rather than magneto-caloric material. The threaded rods 701, 702, and 703 and plates 704 are preferably made out of gold plated high conductivity oxygen free copper or solid silver. Support rod 703 is electrically insulated from every plate with plastic spacers and attached with nuts to secure each plate in place. A potential difference may be varied between rods 701 and 702 using an external voltage power supply connected to the rods with electrical wires which are attached to the rods at the end of the refrigeration pill. Rods 701 and 702 are electrically isolated from every other plate in a staggered arrangement as shown in the figure using plastic spacers 705 and secured with nuts. On every other plate, rods 701 and 702 are electrically and thermally connected to the plate using nuts as shown in the Figure. This allows for the voltage on every other plate to be identical and for a potential difference to be maintained between each plate. With this multi-layer capacitor geometry large electric fields can be maintained between the plates and used to facilitate electro-caloric refrigeration once the electro-caloric material has been grown onto the plates out of solution or pressed or glued onto the plates in powder form using the same methods as the previously described magneto-caloric refrigeration pills.

Figure 8A:
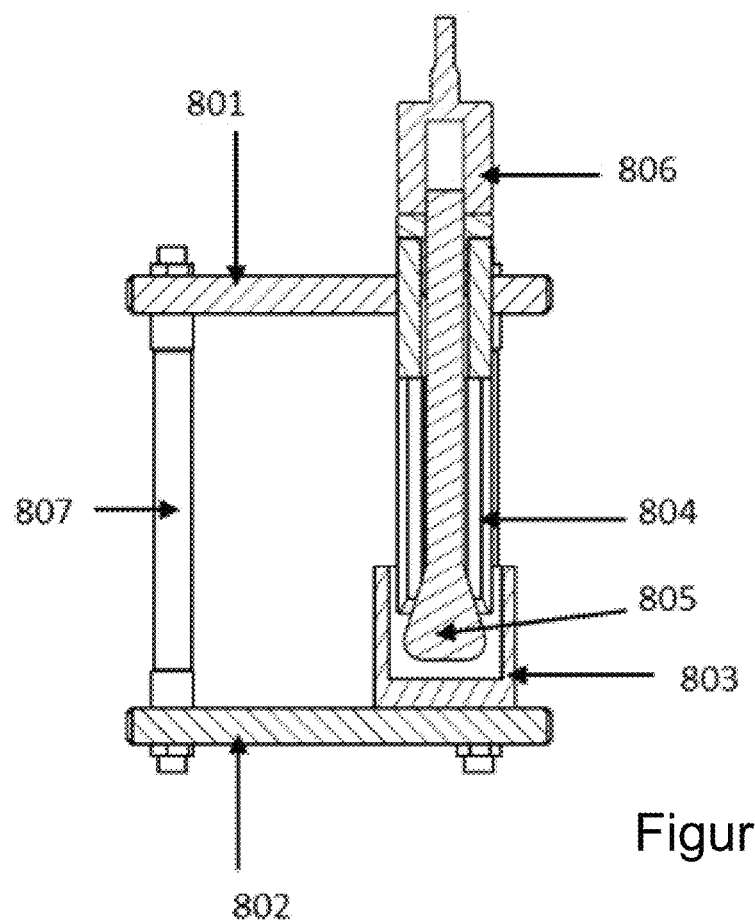
FIGS. 8a and 8b illustrate a mechanical heat switch for a solid state adiabatic refrigerator according to an embodiment of the invention showing in (a), a cross section of the mechanical heat switch and in (b) a three dimensional view of parts of the switching mechanism.
Figure 8B:
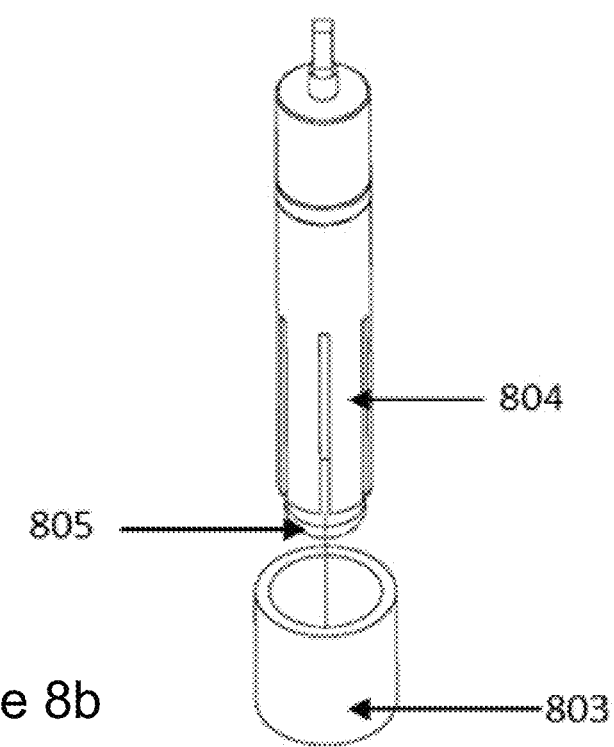

FIG. 8 shows a mechanical heat switch. In FIG. 8a a cross section of the mechanical heat switch is shown and in FIG. 8b a three dimensional view of the key parts of the switching mechanism is shown. Two plates 801 and 802 may be thermally connected or disconnected using the mechanism comprising parts 803, 804, 805 and 806. Low thermal conductivity rods 807 are used to support the plates whether the heat switch is open or closed. A gold plated high-conductivity oxygen-free copper cup 803 is thermally anchored to the lower plate 802. Gold plated metal spring fingers 804 may be extended or retracted in the radial (horizontal) direction using a conical stainless steel rod 805 connected to a screw threaded mechanism 806 which is used to raise and lower the conical rod in the vertical direction either manually or with a motor. The spring fingers 804 are thermally anchored to the top plate 801 at all times. By raising the conical rod, the spring fingers are extended radially outwards and may be pressed against the cup 803, thus thermally connecting plates 801 and 802. By lowering the conical rod the spring fingers are retracted radially inwards and become detached from the cup 803, thus thermally disconnecting plates 801 and 802.

Figure 9:
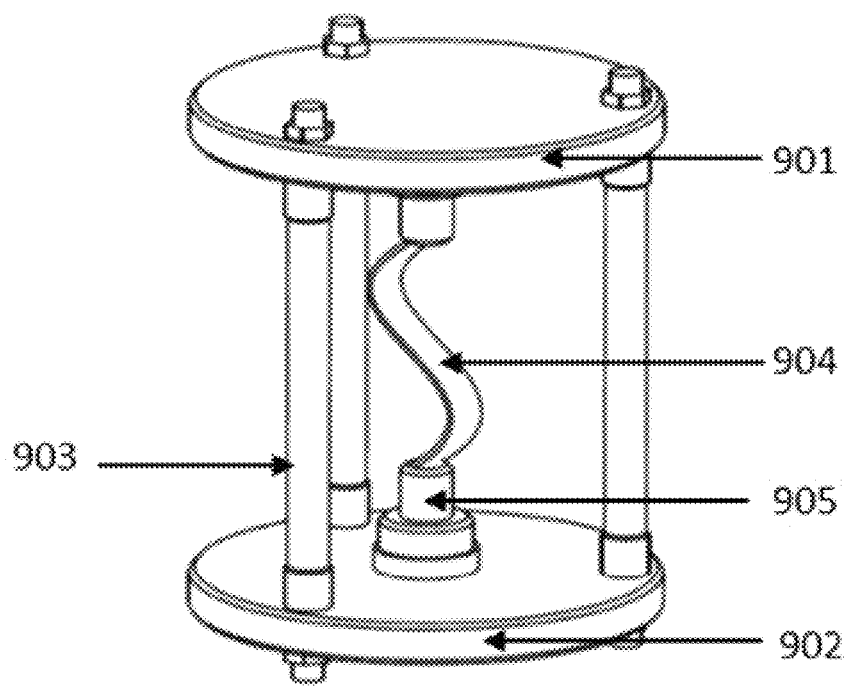
FIG. 9 shows a schematic illustration of a superconducting heat switch which may be used in embodiments of the invention.

FIG. 9 shows a superconducting heat switch. Two plates 901 and 902 supported by low thermal conductivity rods 903 may be thermally connected or disconnected using a superconducting material 904 such as high purity lead or tin at any temperature below the superconducting transition temperature of the material. The strip 904 is soldered at each end to oxygen-free high conductivity copper platforms 905 which are thermally anchored to the plates 901 and 902. When in the superconducting state, the strip 904 has a very low thermal conductivity and thus the plates 901 and 902 are essentially thermally disconnected from each other. By applying a sufficiently large magnetic field, the strip 904 can be transformed into its normal (non-superconducting) metallic state, having a high thermal conductivity, and thus thermally connecting the plates 901 and 902.

A refrigeration pill according to an embodiment of the invention may be used in an adiabatic refrigeration system.

Figure 10:
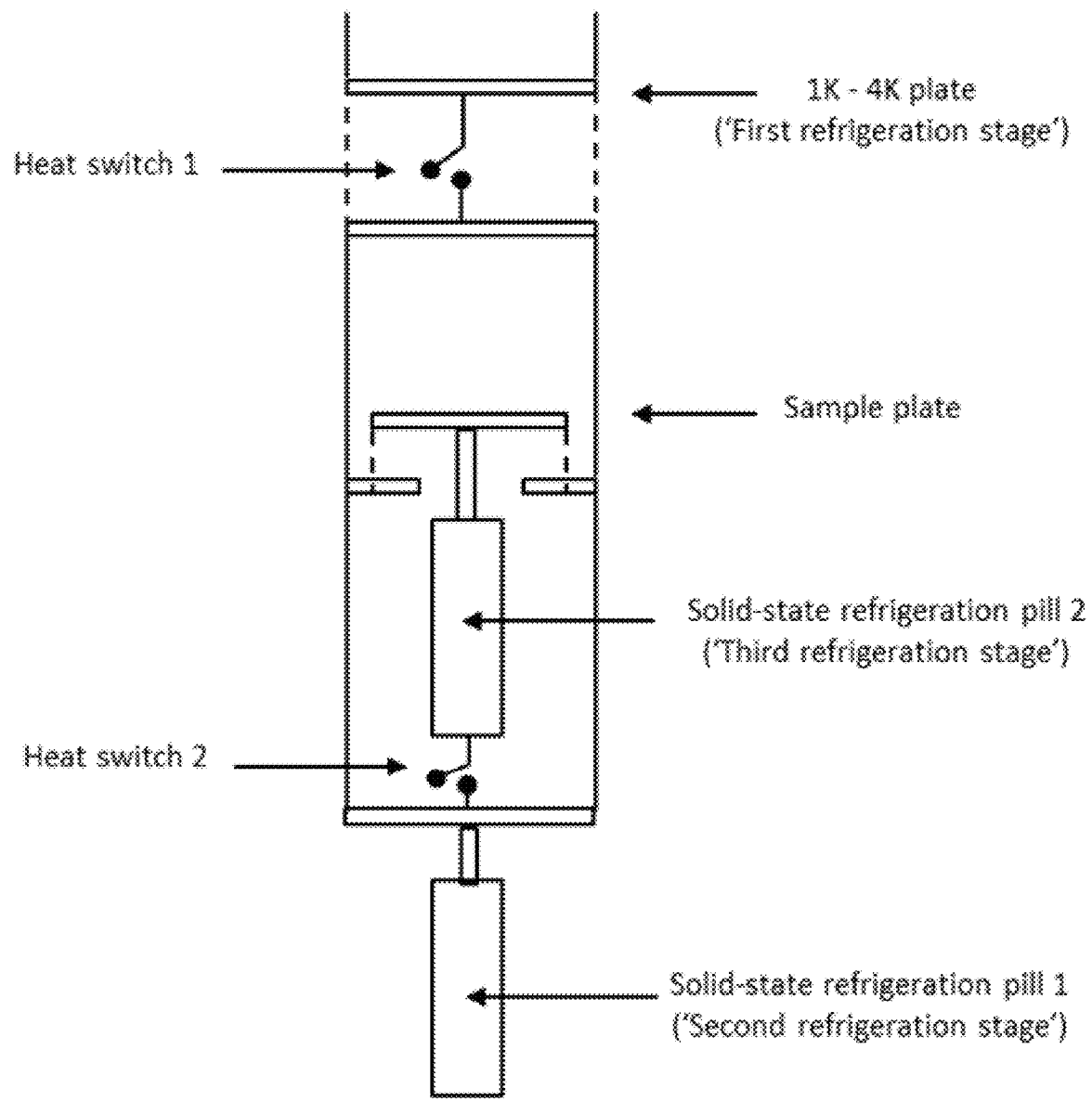
FIG. 10 shows a schematic illustration of the lower part of the sample holding portion of an adiabatic solid-state refrigeration system comprising, in the illustrated example, two solid-state refrigeration stages for serial cooling.

More particularly, FIG. 10 shows an example adiabatic solid-state refrigeration system with two stages for serial cooling, showing a schematic of the lower part of an inner vacuum chamber of a cryogenic insert used to refrigerate samples in vacuum down to milli-Kelvin temperatures with solid-state refrigeration pills. Solid lines denote thermal conductors and dashed lines denote thermal insulators. By employing two or more solid-state refrigeration pills containing the same or different solid-state refrigeration material, and arranged in a series configuration, a lower overall base temperature may be achieved than in the case of using a single refrigeration pill. A refrigeration procedure may proceed as follows using the example of two refrigeration pills in series. Initially both heat switches as shown in the figure are closed and both pills and sample plate are cooled to the temperature of the thermal bath, typically a 4K or 1K plate held at a constant temperature by an external refrigeration device not under consideration here. Both pills are magnetised using solenoids and the temperature of each part of the system is allowed to equilibrate back to the 1K/4K plate temperature. Heat switch 1 is then opened and refrigeration pill 1 is demagnetised adiabatically by sweeping down the magnetic field applied to pill 1 sufficiently slowly. Refrigeration pills 1 and 2 and the sample plate then reach the first cooling stage temperature. At this time, heat switch 2 is opened and refrigeration pill 2 is demagnetised adiabatically. As a result the sample plate and any attached sample are cooled from the first stage temperature to the second stage temperature. With this method 1 mK temperatures have been achieved. In the case when the active solid-state refrigeration material is an electro-caloric as opposed to magneto-caloric material, electric fields are applied instead of magnetic fields using the multi-layer capacitor geometry of the internal structure of the pill.

Continuing to refer to FIG. 10, the skilled person will appreciate that in a simple refrigeration system only a single solid-state pill need be employed. If used with a system as described later with reference to FIG. 12 the sample holder and pill combination may replace the solid-state refrigeration devices shown in that Figure (described later). In such an arrangement the sample holder of FIG. 10 may be enclosed in an evacuated vacuum can and this may, in turn, fit within the vacuum tube of FIG. 12. Preferably the components are arranged so that the 1 K-4 K plates of the holder and those shown in the FIG. 12 system are aligned at substantially the same level (or, if not, thermally linked, for example by a vertical metal heat conductor or conductive coating(s) on the vacuum tube wall(s))—with such arrangements there can be sufficient lateral thermal conduction through the vacuum can walls to enable efficient cooling.

Figure 11:
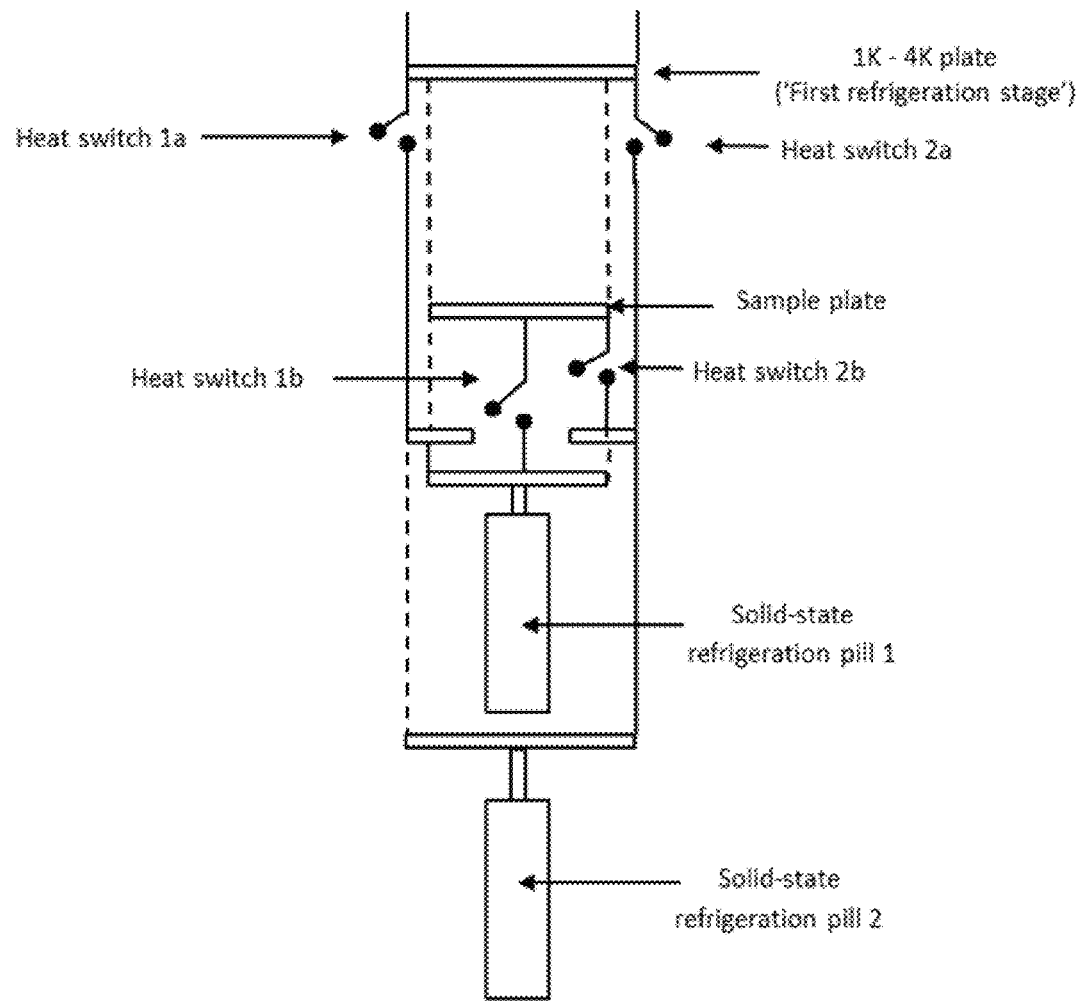
FIG. 11 shows a schematic illustration of an adiabatic solid-state refrigeration system comprising two solid-state refrigeration stages for parallel, continuous cooling.

FIG. 11 shows a schematic of the lower part of an inner vacuum chamber of a cryogenic insert used to refrigerate samples in vacuum down to milli-Kelvin temperatures with solid-state refrigeration pills. Solid lines denote thermal conductors and dashed lines denote thermal insulators. By employing more than one solid-state refrigeration pill arranged in a parallel configuration as indicated, a sample may be continuously cooled. A continuous refrigeration cycle may proceed as follows using the example of two refrigeration pills in parallel as shown in the figure. Initially all the heat switches are closed and both pills and sample plate are cooled to the temperature of the thermal bath, typically via a 4 K or 1 K plate held at a constant temperature by an external refrigeration device not under consideration here. Both pills are magnetised using solenoids and the temperature of each part of the system is allowed to equilibrate back to the 1K/4K plate temperature. Heat switch 1*a* and 2*b* are then opened and with heat switch 1*b* closed, refrigeration pill 1 is demagnetised adiabatically and thus the sample plate and any attached sample are cooled due to the magneto-caloric effect. Heat switch 1*b* is then opened, heat switch 1*a* closed, heat switch 2*a* opened and heat switch 2*b* closed. Refrigeration pill 2 is then demagnetised while simultaneously refrigeration pill 1 is magnetised over the same time period. Once complete, the positions of all the heat switches are inverted followed by demagnetising pill 1 and magnetising pill 2. This process may be continually cycled to continuously cool the sample plate and any sample maintaining a temperature below that of the 1 K/4 K plate typically in the milli-Kelvin range. In the case when the active solid-state refrigeration material is an electro-caloric as opposed to magneto-caloric material, electric fields are applied instead of magnetic fields using the multi-layer capacitor geometry of the internal structure of the pill.

Cryogenic Platform

In embodiments a cryogenic platform is used to produce initial cooling of the sample insert and solid-state refrigeration device(s). Typically the initial cooling is to a temperature in the range 1 K to 4 K, for example using either liquid-cryogens such as liquid helium-4 or liquid-cryogen free systems such as a pulse tube cooler or Gifford-McMahon cooler. A sample insert, for example as shown in FIGS. 10 and 11, with one or more refrigeration pills attached and sealed inside a vacuum tube, may be lowered into the cryogenic platform for initial cooling. Subsequent cooling to lower temperatures may then proceed by operating the solid-state refrigeration devices and heat switches. In an alternative arrangement, the solid-state refrigeration stage may be incorporated into the cryogenic platform itself, as shown in FIG. 12, the sample platform making thermal contact with a solid-state refrigerator located on the cryogenic platform.

Figure 12:
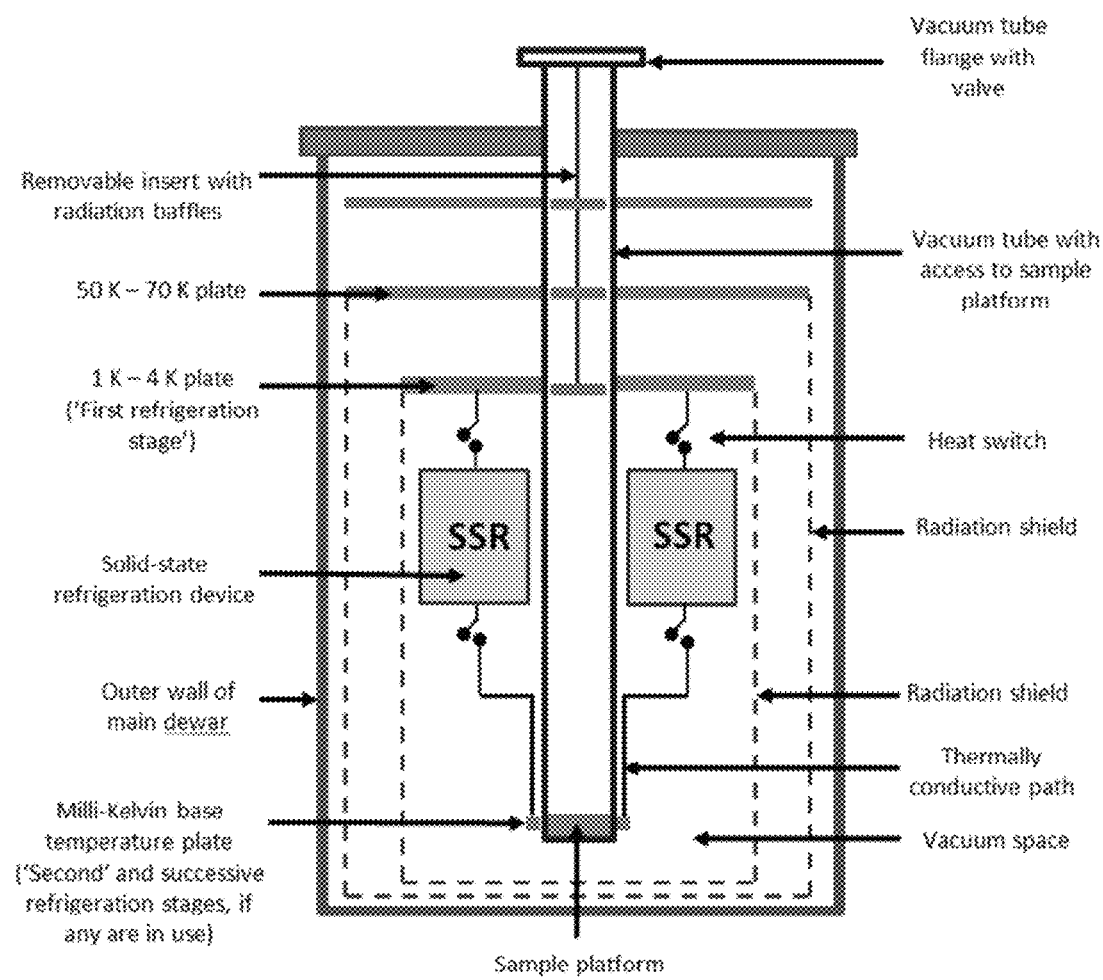
FIG. 12 shows a schematic illustration of an adiabatic solid-state refrigeration system with a facility for the refrigeration to be carried out displaced away from a sample platform, thermal contact being made through a boundary.

FIG. 12 shows a schematic diagram showing a cross-section of a simplified cryogenic platform. In embodiments such a platform allows the temperature of a sample or device under test to be continuously varied between room temperature and the low milli-Kelvin range. In particular embodiments, other parameters such as the sample magnetic field, electric field or pressure, may be varied as well as the temperature. The cryogenic platform comprises a metal dewar, the interior of which is pumped out and maintained at a high vacuum. The interior of the dewar contains metal mounting platforms, refrigeration plates, thermal radiation shields, a vacuum tube for sample access, one or more solid-state refrigeration devices (SSR), one or more heat switches and a sample platform. When running, a cryogenic (1 K-4 K) plate is cooled by a liquid-cryogen free system such as a pulse tube cooler or Gifford-McMahon cooler built into the cryogenic platform (not shown). The solid-state refrigeration device (SSR) may be made from a magneto-caloric material, in which case it may comprise a refrigeration pill, for example as described in any one of FIGS. 1 to 6, plus an encapsulating solenoid to apply a magnetic field to the refrigeration pill. Alternatively it may be made from a thermoelectric or an electrocaloric material; in the latter case it may comprise a refrigeration pill made from a multi-layer capacitor such as that described with reference to FIG. 7. The heat switches may be mechanical, for example as shown in FIG. 8, superconducting as shown in FIG. 9, piezoelectric, or helium gas based. Thermal radiation shields are preferably installed to help thermally isolate the sample space and SSRs.

In operation, with the heat switches closed, one or more solid-state refrigeration devices as well as the base temperature plate and the sample platform are cooled to the temperature of the (1 K-4 K) plate. A sample mounted on a sample holder such as a puck (not shown in the Figure) may be lowered into the vacuum tube of the cryogenic platform and attached to the sample platform using a removable insertion rod. An insert fitted with radiation baffles may then optionally be placed inside the vacuum tube and sealed on the top flange to help prevent the sample from being heated by thermal radiation. One or more SSR devices may then be operated along with the heat switches to cool the sample below the cryogenic (1 K-4 K) plate temperature to a temperature typically in the low milli-Kelvin range.

In a particularly simple mode of operation, the cryogenic platform is fitted with a single SSR and may then be used with a single heat switch installed between the SSR and the cryogenic (1 K-4 K) plate. In this case, using the example of a magnetocaloric SSR, the magnetocaloric material is magnetised, the SSR and the sample platform left to equilibrate at the cryogenic (1 K-4 K) plate temperature. The heat switch is then opened and the SSR demagnetised adiabatically resulting in the sample plate cooling to a temperature in the low milli-Kelvin range.

In more advanced embodiments, one or more SSRs may be used in series or parallel modes to allow for a lower base temperatures or continuous cooling respectively. FIG. 12 shows an example based on two SSRs which may be operated in either series or parallel mode, depending on user requirements.

No doubt many other effective alternatives will occur to the skilled person. It will be understood that the invention is not limited to the described embodiments and encompasses modifications apparent to those skilled in the art lying within the spirit and scope of the claims appended hereto.

We claim:

1. A method of manufacturing a refrigeration pill for a solid-state magnetocaloric or electrocaloric refrigerator, the pill having longitudinal and transverse axes, said pill comprising a housing containing: an internal mounting structure divided along said longitudinal axis into first and second mounting parts; wherein each of said mounting parts comprises a thermally conducting metal skeleton defined by the respective said mounting part; and wherein regions within said housing between elements of said skeleton comprise magnetocaloric or electrocaloric material, the method comprising:
    providing the internal mounting structure in the first and second mounting parts;
    growing a crystal structure of the magnetocaloric or the electrocaloric material on the metal skeleton of each said mounting part; and
    assembling said mounting parts to manufacture said refrigeration pill.

2. The method as claimed in claim 1 wherein said metal skeleton comprises a set of transverse metal fins spaced at intervals along said longitudinal axis; and wherein regions between said fins are filled with magnetocaloric or electrocaloric material.

3. The method as claimed in claim 1 wherein said metal skeleton comprises a plurality of metal rods or wires running in a longitudinal direction within each said mounting part.

4. The method as claimed in claim 1, wherein each of said mounting parts defines a metal exoskeleton and wherein said metal skeleton further comprises metal filaments or dendrites within said magnetocaloric material.

5. The method as claimed in claim 4 wherein said metal filaments or dendrites comprise silver.

6. The method as claimed in claim 1 wherein said regions of said mounting parts between elements of said skeleton are filled with said magnetocaloric or electrocaloric material, and wherein said magnetocaloric or electrocaloric material is bonded directly to said metal skeleton.

7. The method as claimed in claim 1 wherein said magnetocaloric or electrocaloric material is grown as a crystal on each of said first and second mounting parts with an axis of said growth perpendicular to said longitudinal axis.

8. The method as claimed in claim 1 wherein said refrigerator is an adiabatic de-magnetisation refrigerator, and wherein said magnetocaloric or electrocaloric material is a magnetocaloric material.

9. The method as claimed in claim 1 where said magnetocaloric or electrocaloric material is an electrocaloric material; wherein said metal skeleton comprises a set of transverse metal fins spaced at intervals along said longitudinal axis; and wherein pairs of adjacent fins are electrically isolated from one another to form a multi-layer capacitor geometry with said electrocaloric material between plates of said multi-layer capacitor.

10. The method as claimed in claim 1 wherein each of said mounting parts comprises a pair of pill end stops, one towards either end of the mounting part, said metal skeleton extending longitudinally between them, the pill including a sealing mechanism comprising a longitudinally moveable sealing part and a mechanism to force said sealing part towards said end stop, wherein said end stop and said sealing part define a channel adjacent an internal surface of said wall of said housing, said channel comprising a sealant such that when said sealing part is forced towards said end stop said sealant is forced outwards to form a seal against said internal surface of said wall of said housing.

11. A method of manufacturing a refrigeration pill for an solid-state magnetocaloric or electrocaloric refrigerator, the pill having longitudinal and transverse axes, said pill comprising: a longitudinal housing and a pair of pill end stops, one towards either end of the housing; wherein said end stops carry a thermally conducting metal skeleton extending longitudinally between them; wherein said end stops are sealed against a wall of said housing; and wherein regions within said housing between elements of said skeleton comprise magnetocaloric or electrocaloric material, the method comprising:
    providing a mounting structure in two parts divided along the longitudinal axis of said refrigeration pill, said mounting structure having the metal skeleton;
    growing a crystal structure of the magnetocaloric or the electrocaloric material on the skeleton of each said mounting part; and
    assembling said mounting parts to manufacture said refrigeration pill.

12. The method as claimed in claim 11 wherein a said end stop comprises a sealing mechanism, the sealing mechanism comprising a longitudinally moveable sealing part and a mechanism to force said sealing part towards said end stop, wherein said end stop and said sealing part define a ring-shaped region adjacent an internal surface of said wall of said housing, said ring-shaped region comprising a sealant such that when said sealing part is forced towards said end stop said sealant is forced outwards to form a seal against said internal surface of said wall of said housing.

13. The method as claimed in claim 11 wherein said metal skeleton comprises a set of rods or wires, or mesh, extending longitudinally between said end stops.

14. The method as claimed in claim 11, wherein said metal skeleton further comprises metal filaments or dendrites within said magnetocaloric material.

15. The method as claimed in claim 14 wherein said metal filaments or dendrites comprise silver.

16. The method as claimed in claim 11 wherein said regions between elements of said skeleton are filled with said magnetocaloric or electrocaloric material, and wherein said magnetocaloric or electrocaloric material is bonded directly to said metal skeleton.

17. The method as claimed in claim 11 wherein said magnetocaloric or electrocaloric material is grown as a crystal on said skeleton with an axis of said growth perpendicular to said longitudinal axis.

18. The method as claimed in claim 11 wherein said refrigerator is an adiabatic de-magnetisation refrigerator, and wherein said magnetocaloric or electrocaloric material is a magnetocaloric material.

19. The method as claimed in claim 11 where said magnetocaloric or electrocaloric material is an electrocaloric material; and wherein said metal skeleton comprises a set of transverse metal fins spaced at intervals along said longitudinal axis; and wherein pairs of adjacent fins are electrically isolated from one another to form a multi-layer capacitor geometry.

20. An adiabatic solid-state refrigerator comprising the refrigeration pill manufactured by the method as recited in claim 11.

21. The method as claimed in claim 1 or 11 wherein said growing is performed with said longitudinal axis of each said mounting part horizontal.

22. The method as claimed in claim 1 or 11 wherein said growing comprises growing said crystal structure of magnetocaloric or electrocaloric material around said metal skeleton.

23. The method as claimed in claim 4 or 14 wherein said metal filaments or dendrites are grown within said crystal structure during said growing of said crystal structure.

* * * * *